United States Patent
Yvon et al.

(10) Patent No.: US 11,949,023 B2
(45) Date of Patent: Apr. 2, 2024

(54) THIN DIODES

(71) Applicant: STMicroelectronics (Tours) SAS, Tours (FR)

(72) Inventors: Arnaud Yvon, Saint-Cyr sur Loire (FR); Lionel Jaouen, Saint-Cyr sur Loire (FR)

(73) Assignee: STMicroelectronics (Tours) SAS, Tours (FR)

( * ) Notice: Subject to any disclaimer, the term of this patent is extended or adjusted under 35 U.S.C. 154(b) by 42 days.

(21) Appl. No.: 17/556,634

(22) Filed: Dec. 20, 2021

(65) Prior Publication Data
US 2022/0209024 A1 Jun. 30, 2022

(30) Foreign Application Priority Data
Dec. 24, 2020 (FR) ...................................... 2014147

(51) Int. Cl.
*H01L 29/861* (2006.01)
*H01L 21/761* (2006.01)
*H01L 29/06* (2006.01)
*H01L 29/66* (2006.01)

(52) U.S. Cl.
CPC ........ *H01L 29/8611* (2013.01); *H01L 21/761* (2013.01); *H01L 29/0623* (2013.01); *H01L 29/66128* (2013.01); *H01L 29/66136* (2013.01)

(58) Field of Classification Search
CPC .............. H01L 29/8611; H01L 21/761; H01L 29/66128; H01L 29/66136; H01L 29/0615; H01L 29/402; H01L 2924/12036; H01L 29/0619–0623
See application file for complete search history.

(56) References Cited

U.S. PATENT DOCUMENTS

| | | | |
|---|---|---|---|
| 8,395,244 B2 | 3/2013 | Vobecky et al. | |
| 2007/0246791 A1* | 10/2007 | Schulze | H01L 29/0615 |
| | | | 257/E29.066 |
| 2009/0267200 A1* | 10/2009 | Gutt | H01L 29/0615 |
| | | | 257/E21.334 |
| 2016/0240644 A1* | 8/2016 | Müller | H01L 27/0727 |

FOREIGN PATENT DOCUMENTS

WO 2004/066397 A2 8/2004

OTHER PUBLICATIONS

Masuoka et al., "Great Impact of RFC Technology on Fast Recovery Diode towards 600 V for Low Loss and High Dynamic Ruggedness," Proceedings of the 2021 24$^{th}$ International Symposium on Power Semiconductor Devices and ICs, Jun. 3-7, 2012, Bruges, Belgium, pp. 373-376.

Nishii et al., "Relaxation of Current Filament due to RFC Technology and Ballast Resistor for Robust FWD Operation," Proceedings of the 23$^{rd}$ International Symposium on Power Semiconductor Devices & IC's, May 23-26, 2011, San Diego, CA, pp. 96-99.

* cited by examiner

*Primary Examiner* — Shahed Ahmed
(74) *Attorney, Agent, or Firm* — Seed IP Law Group LLP

(57) ABSTRACT

A device includes a diode. The anode of the diode includes first, second, and third areas. The first area partially covers the second area and has a first doping level greater than a second doping level of the second area. The second area partially covers the third area and has the second doping level greater than a third doping level of the third area. A first insulating layer partially overlaps the first and second areas.

18 Claims, 3 Drawing Sheets

THIN DIODES

CROSS-REFERENCE TO RELATED APPLICATION(S)

This application claims the priority benefit of French patent application number "FR2014147," filed on Dec. 24, 2020, entitled "Diodes fines," which is hereby incorporated by reference to the maximum extent allowable by law.

BACKGROUND

Technical Field

The present disclosure generally concerns electronic devices and their manufacturing methods, and more particularly devices comprising diodes.

Description of the Related Art

Electronic devices, in particular electronic devices capable of being installed in automobiles, comprise modules comprising a diode and an insulated gate bipolar transistor (IGBT), dedicated to controlling the motor. In this context, the diodes may receive a current switching speed capable of reaching 5,000 Mts.

Typically, thin diodes are used in this type of module, since they enable to associate the diode and the transistor across a relatively similar thickness. However, thin diodes are adapted to current switching speeds around 2,000 A/µs. Higher switching values cause a degradation, or even a destruction, of the diode.

BRIEF SUMMARY

There is a need for diodes adapted to high current switchings.

An embodiment overcomes all or part of the disadvantages of known devices comprising diodes.

An embodiment provides a device comprising a diode wherein the anode of the diode comprises first, second, and third areas, the first area partially covering the second area and having a doping level greater than the doping level of the second area, the second area partially covering the third area and having a doping level greater than the doping level of the third area, a first insulating layer partially overlapping the first and second areas.

An embodiment provides a method of manufacturing a diode comprising the forming of first, second, and third areas, the first area partially covering the second area and having a doping level greater than the doping level of the second area, the second area partially covering the third area and having a doping level greater than the doping level of the third area, a first insulating layer partially overlapping the first and second areas.

According to an embodiment, the first area is covered with the first insulating layer and a conductive layer.

According to an embodiment, the doping level of the first area is at least 10 times greater than the doping level of the second area and the doping level of the second area is at least 10 times greater than the doping level of the third area.

According to an embodiment, the doping level of the first area is in the range from 1e17 atoms/cm3 to 1e20 atoms/cm3, the doping level of the second area is in the range from 1e15 atoms/cm3 to 1e17 atoms/cm3, and the doping level of the third area is in the range from 1e14 atoms/cm3 to 1e17 atoms/cm3.

According to an embodiment, the overlapping of the first area by the first insulating layer extends over a length at least equal to 5 µm, preferably at least equal to 10 µm.

According to an embodiment, the overlapping of the first area by the first insulating layer extends over a portion in the range from one quarter to three quarters of the overlapping of the second area by the first insulating layer.

According to an embodiment, the first insulating layer extends over the entire periphery of the first area.

According to an embodiment, at least a portion of the third area extends down to a depth greater than the depth of the first and second areas.

According to an embodiment, the first, second, and third areas are in contact with the first insulating layer.

According to an embodiment, the method comprises the forming, in a semiconductor substrate, of a guard ring in the periphery of the location of the diode, the ring having a doping level substantially to that of the third area.

According to an embodiment, the method comprises the forming of a second insulating layer comprising a first opening exposing the substrate inside of the ring and a portion of the ring and comprising the doping, through the first opening, of a portion of the substrate with the doping level of the second area.

According to an embodiment, the method comprises the forming of a third insulating layer and the doping, through the third insulating layer, of a portion of the substrate with the doping level of the first area.

According to an embodiment, the method comprises the forming of a second opening partially exposing the location of the first area.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the use of the device comprising the diode will not be described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
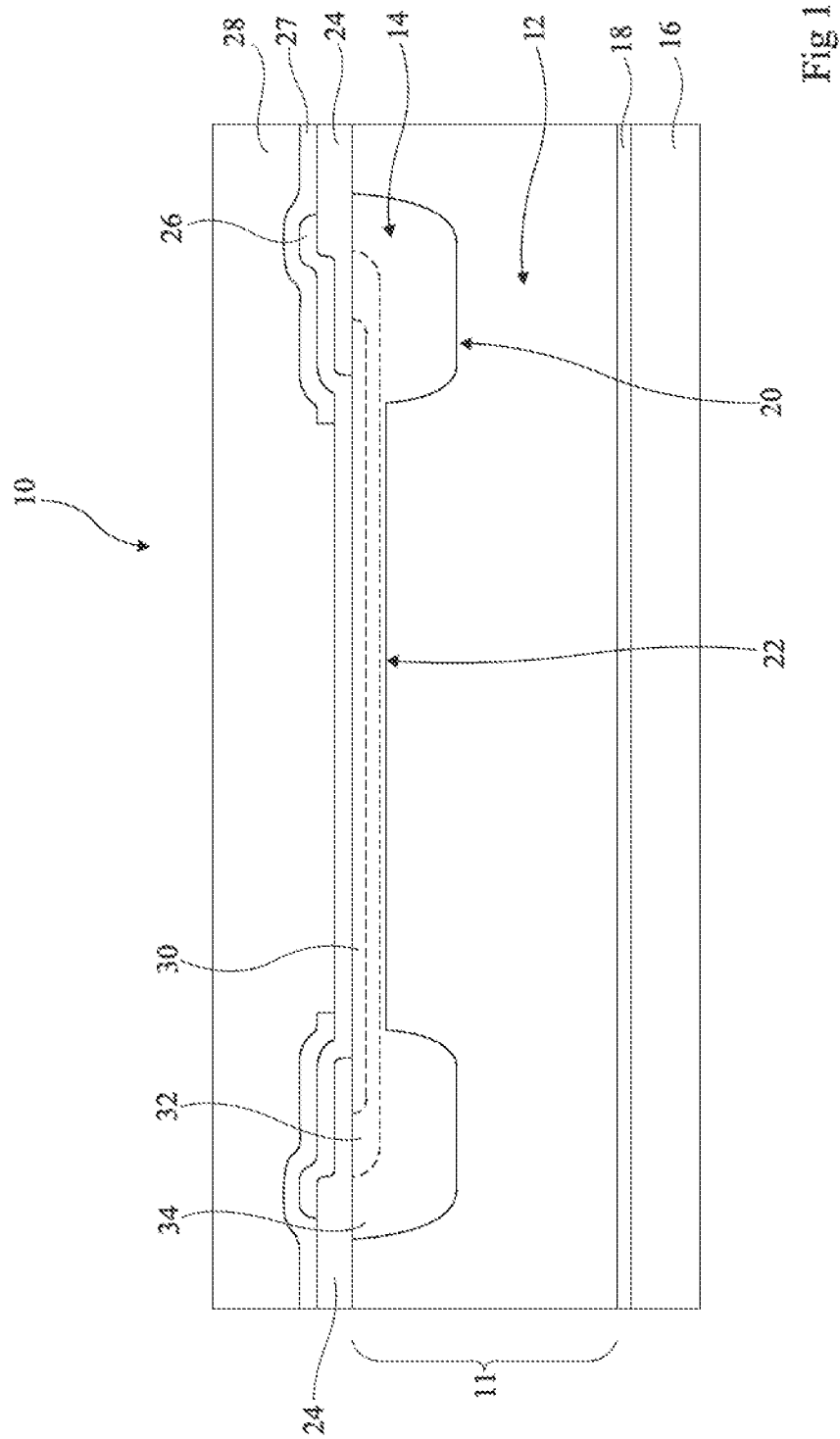
FIG. 1 shows an embodiment of a device comprising a diode.

FIG. 1 shows an embodiment of a device comprising a diode 10.

The device comprises a substrate 11. Substrate 11 is made of a semiconductor material, for example, of silicon. Preferably, diode 10 is a thin diode. In other words, the substrate thickness, for example corresponding to the diode thickness, is preferably smaller than 150 μm, preferably smaller than 100 μm, for example, substantially equal to 90 μm.

Substrate 11 comprises a region 12. Region 12 is made of the same semiconductor material as substrate 11. Region 12 is doped with a first conductivity type. Preferably, region 12 is N-type doped. Region 12 then forms the cathode of diode 10.

The device further comprises a region 14 located on top of and preferably in contact with region 12. Region 14 is made of the same semiconductor material as substrate 11. Region 14 is doped with a second conductivity type, different from the first conductivity type. Preferably, region 14 is P-type doped. Region 14 then forms the anode of diode 10. The interface between region 12 and region 14 forms the PN junction of the diode. The diode thus is a so-called "vertical" diode, that is, the stack of the P region and of the N region is vertical. In other words, the PN junction, that is, the interface plane between the P doped region and the N doped region, is horizontal.

The device further comprises a support 16. Support 16 is for example made of a conductive material, for example, of copper.

Substrate 11 is located on support 16. Preferably, substrate 11 is separated from support 16 by a conductive layer 18. Layer 18 is preferably made of a metal. Layer 18 is for example a weld metal layer enabling to bond substrate 11 to support 16. Layer 18 forms an electrode of the diode, connected to the cathode.

Thus, the device comprises a stack comprising, in this order, support 16, layer 18, and substrate 11. Preferably, region 12 forms a lower portion of substrate 11 and region 14 forms an upper portion of substrate 11. The stack thus preferably comprises, in this order, support 16, layer 18, region 12, and region 14.

For example, layer 18 entirely covers support 16 opposite diode 10. Similarly, substrate 11 preferably entirely covers layer 18 at the level of the diode.

Preferably, portion 12 thus extends from layer 18, that is, from a lower surface of substrate 11, that is, from a lower surface of substrate 11, to the interface with region 14. Preferably, region 14 extends from the interface with region 12 to an upper surface of substrate 11.

Region 14 comprises a portion 20, or guard ring. Portion 20 is preferably located at the periphery of diode 10. Portion 20 is thus at the periphery of anode 14. Thus, the active area of diode 10 is preferably located inside of ring 20 and/or under ring 20.

Region 14 further comprises a portion 22 extending inside of ring 20. Portion 20 thus surrounds portion 22. More particularly, portion 22 extends all over the surface of substrate 11 inside of ring 20. Portion 20 is deeper than portion 22, for example, at least twice deeper. Portion 22 preferably has a substantially constant depth. Portions 20 and 22 both extend from the upper surface of the substrate.

The device further comprises a layer 24 of an insulating material. Layer 24 extends over, preferably in contact with, the upper surface of substrate 11. More particularly, layer 24 preferably extends over at least a portion of portion 20 and over the upper surface of substrate 11 surrounding portion 20. Layer 24 preferably does not extend over portion 22.

The end of layer 24, that is, the portion closest to portion 22, for example has a thickness smaller than the rest of layer 24. The portion having a lower thickness is located on portion 20, preferably only on portion 20. Layer 24 thus preferably has a first thickness, preferably substantially constant, opposite the substrate outside of ring 20 and, preferably, over a portion of the ring. Layer 24 thus preferably has a second thickness preferably substantially smaller than the first thickness, opposite a portion of portion 20, at the level of the end of layer 24.

The device further comprises a conductive layer 26, for example, made of metal. Layer 26 is located on, preferably in contact with, portion 22. Layer 26 further at least partially covers the end of layer 24 having the second thickness. Preferably, layer 26 entirely covers the end of layer 24 having the second thickness. Layer 26 preferably partially covers the portion of layer 24 having the first thickness. Layer 26 forms an electrode of the diode, connected to the anode.

The device comprises an insulating layer 27. Layer 27 is a passivation layer. Layer 27 covers layer 24, preferably entirely, and partially covers layer 26. A portion, for example, the central portion, of layer 26 is not covered with layer 27, enabling to form electric contacts (not shown) with layer 26. The device further comprises a protection layer 28. Layer 28 is preferably made of an insulating material. Layer 28 is for example made of resin. Layer 28 covers conductive layer 26 and layer 24.

Region 14 comprises three doping levels. The first doping level is located in an area 30 surrounded with dotted lines. Area 30 allows a more efficient connection between the cathode and electrode 26. The first doping level for example corresponds to a doping in the range from 1e17 atoms/cm3 to 1e20 atoms/cm3. The second doping level is located in an area 32 surrounded with dotted lines. The second doping level for example corresponds to a doping in the range from 1e15 atoms/cm3 and 1e17 atoms/cm3. Preferably, the first doping level is greater than at least ten times, preferably at least one hundred times, the value of the second doping. The areas of region 22 which are neither in area 30 nor in area 32 form an area 34. Area 34 is thus located in the periphery of the diode, in other words, on the outside of the diode. Area 34 has the third doping level. The third doping level for example corresponds to a doping in the range from 1e14 atoms/cm3 to 1e17 atoms/cm3. Preferably, the second doping level is greater than at least ten times, the value of the third doping.

Area 30 is preferably located at the level of the upper surface of the substrate in the entire portion 22. Area 30 is thus in contact with layer 26. Further, area 30 extends under, and is contact with, layer 24, in particular under the end of layer 24 having the second thickness. Layer 24 thus overlaps a portion of area 30.

Area 32 surrounds area 30. Thus, area 32 extends under, and in contact with, area 30. In other words, area 32 extends opposite area 30. Further, area 32 extends along the lateral walls of area 30, to reach layer 24. Area 32 extends opposite the entire portion 22. Further, area 32 partially extends opposite layer 24. In particular, area 32 extends opposite the end of layer 24 having the second thickness. Preferably, area 32 extends all the way to the limit of the portion of layer 24 having a substantially constant thickness, substantially equal to the first thickness. In other words, area 32 extends all the way to the separation between the portion having a substantially constant thickness substantially equal to the first thickness and the portion having a thickness smaller than the first thickness. Area 32 is thus in contact with layer 24.

In practice, area 30 and 32 form the anode of the diode.

Area 34 preferably surrounds area 32. Thus, area 34 preferably extends under, and in contact with, area 32. Preferably, area 34 is not in contact with area 30. In other words, area 34 extends opposite area 30 and area 32. Area 34 preferably extends opposite the entire portion 22. Further, area 34 preferably extends around areas 30 and 32, to reach layer 24. Area 34 extends along the lateral walls of area 32. Thus, area 34 is preferably in contact with layer 24, preferably with the portion having the first thickness. Preferably, area 34 is not in contact with the end of layer 24, that is, with the portion of layer 24 having a thickness smaller than the first thickness. Area 34 is thus in contact with layer 24.

Thus, a portion of layer 24, more particularly a portion of the end, is opposite areas 30, 32, and 34. Another portion of layer 24, more particularly another portion of the end, is opposite areas 32 and 34 but is not opposite area 30. A portion of layer 24, more particularly a portion having a thickness substantially equal to the first thickness, is opposite area 34 but not opposite areas 30 and 32.

In a preferred embodiment, region 22 only comprises areas 30 and 32. Thus, region 22 comprises a lower portion corresponding to area 32 and an upper portion corresponding to area 30. Area 34 is thus only present in region 20. Area 34 thus surrounds, in this embodiment, the active area of the diode. Area 34 is thus located in the diode periphery.

The overlapping, or covering, of area 30 by layer 24 preferably extends over a portion in the range from one quarter to three quarters of the overlapping of area 32 by layer 24. In other words, the overlapping of area 30 by layer 24 preferably extends over a length in the range from one quarter to three quarters of the length of the overlapping of area 32 by layer 24. The term length means the longest dimension in the cross-section plane of FIG. 1, in other words, the dimension in the direction between the end of layer 34 to the portion of layer 24 having the first thickness.

In other words, the surface area of the overlapping of area 30 by layer 24 corresponds to a portion in the range from one quarter to three quarters of the surface area of the overlapping of area 32 by layer 24.

For example, the overlapping of area 30 by layer 24 preferably extends over a portion of at least 5 µm, preferably of at least 10 µm, for example, in the range from 5 µm to 20 µm, for example substantially equal to 10 µm.

FIGS. 2A to 2E illustrate steps, preferably successive, of the forming of the structure of FIG. 1. FIGS. 2A to 2E only show a portion of the structure of FIG. 1, the steps of the method being carried out similarly in the portion which is not shown.

Figure 2A:
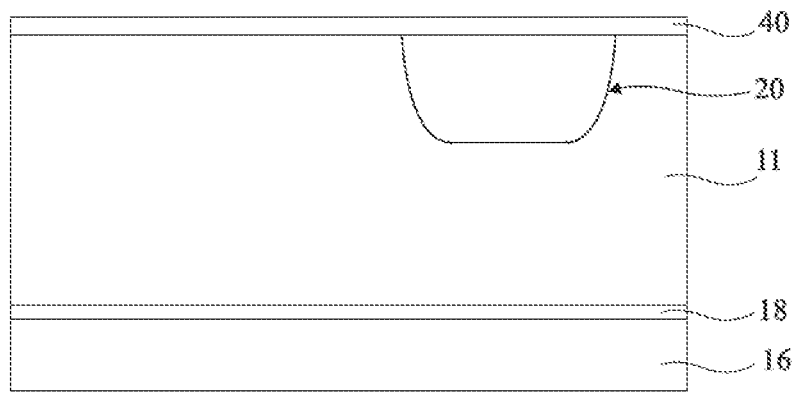
FIG. 2A partially shows the result of a manufacturing step of the embodiment of FIG. 1.

FIG. 2A partially shows the result of a manufacturing step of the embodiment of FIG. 1.

During this step, conductive layer 18 is formed on support 16. Preferably, layer 18 entirely covers support 16 at the location of diode 10.

Support 16 is for example made of an insulating material, for example, of silicon oxide or of silicon nitride, or of a semiconductor material, for example, of silicon. Conductive layer 18 is for example made of a metal.

Semiconductor substrate 11, preferably made of silicon, is formed on layer 18, for example, bonded to the support by layer 18. Substrate 11 is thus at last partially separated from the support by conductive layer 18.

Preferably, substrate 11 is a thin substrate. In other words, substrate 11 preferably has a height smaller than 150 µm, preferably smaller than 100 µm, for example, substantially equal to 90 µm.

A layer 40 is formed on the surface of substrate 11. Layer 40 is made of an insulating material, for example, silicon oxide. Preferably, layer 40 entirely covers the upper surface, that is, the surface most distant from support 16, of substrate 11.

The step of FIG. 2A further comprises the forming of region 20, that is, of the guard ring. Region 20 is formed by doping, preferably with a P-type dopant, a ring surrounding the location of the active area of the diode. Preferably, the doping of region 20 is in the range from 1e14 atoms/cm3 to 1e17 atoms/cm3.

The forming of region 20 for example comprises the preliminary forming of an etch mask, not shown, for example, of resin, covering substrate 11 except for the location of region 20 located opposite an opening. The doping of substrate 11 to form region 20 is performed via the opening in the mask. The etch mask is removed after the forming of region 20.

The guard ring preferably extends over less than half the height of the substrate. The ring thus does not extend, preferably, all the way to layer 18 and support 16. Region 20 is thus separated from support 16 and from layer 18 by a portion of substrate 11 which has not been doped during the forming of region 20.

The forming of the guard ring preferably comprises an anneal step.

Figure 2B:
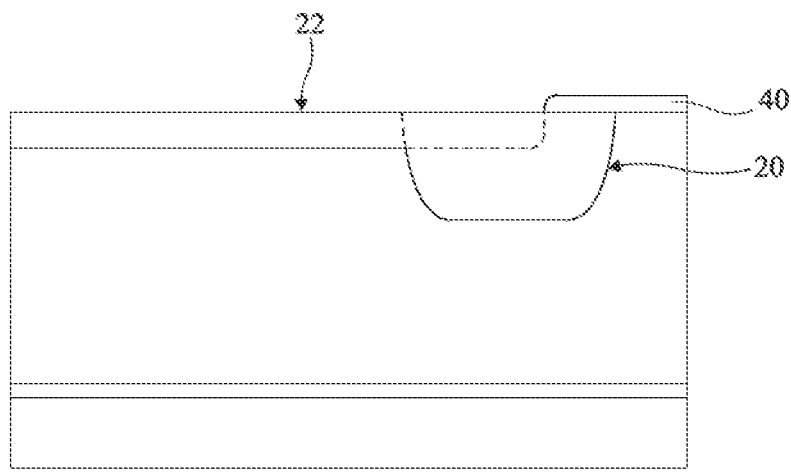
FIG. 2B partially shows the result of another manufacturing step of the embodiment of FIG. 1.

FIG. 2B partially shows the result of another manufacturing step of the embodiment of FIG. 1.

During this step, layer 40 is etched to form an opening exposing the location of area 32, that is, the inside of ring 20 and a portion of the ring, in other words, the region surrounded with the ring and a portion of the ring. Thus, layer 40 partially covers ring 20 and covers substrate 11 outside of ring 20. Preferably, layer 40 is located at the locations of the portion of layer 24 having the first thickness.

This step further comprises the forming of region 22. More particularly, this step comprises the doping of substrate 11 via the opening formed in layer 40. Layer 40 is thus used as an etch mask. The location of area 32 and, preferably, the location of area 30, are thus doped with a doping level corresponding to the doping of area 32. Thus, region 22 and a portion of region 20 are doped with the doping level of area 32. The doping level of area 32 thus stops at the level of the end of layer 40.

The region doped during this step substantially has the depth of region 22 and is thus shallower than region 20.

Figure 2C:
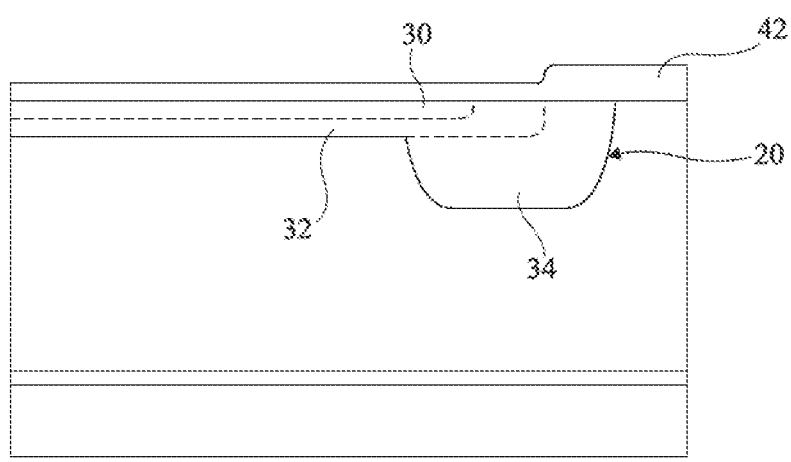
FIG. 2C partially shows the result of another manufacturing step of the embodiment of FIG. 1.

FIG. 2C partially shows the result of another manufacturing step of the embodiment of FIG. 1.

This step comprises the growth of the material of layer 40, preferably silicon oxide, on the structure of FIG. 2B. Layer 40 is thus replaced with layer 42. Layer 42 comprises a first portion, at the location of the layer 40 of FIG. 2B, and a second portion at the location of the opening in layer 40. The first and second portions each have a substantially constant thickness. The thickness of the first portion is greater than the thickness of the second portion, for example, at least twice greater.

This step then comprises the forming of area 30. More particularly, this step comprises the doping, or overdoping, of a portion of the area doped during the step of FIG. 2B. Thus, area 30, more heavily doped than area 32, is formed. This doping step is performed via an opening in an etch mask, not shown.

Figure 2D:
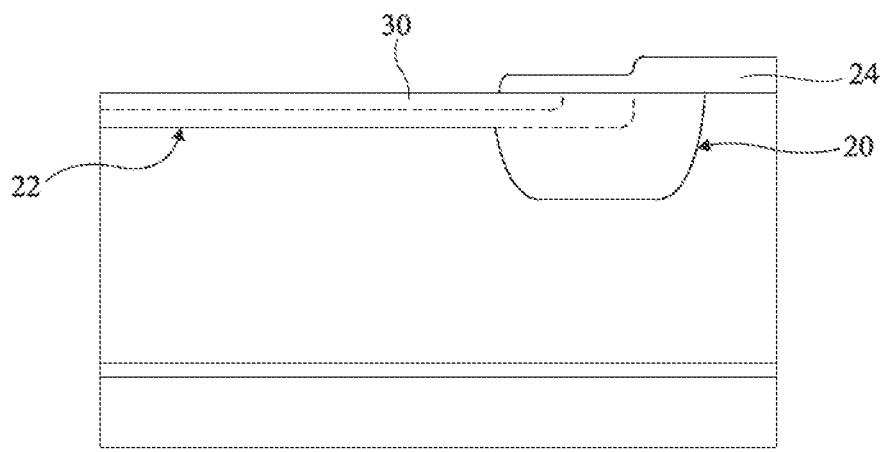
FIG. 2D partially shows the result of another manufacturing step of the embodiment of FIG. 1.

FIG. 2D partially shows the result of another manufacturing step of the embodiment of FIG. 1.

During this step, an opening is formed in layer 42, to form layer 24. The opening in layer 42 partially exposes area 30. The opening does not entirely expose area 30. A peripheral portion of area 30 is covered with layer 24.

Figure 2E:
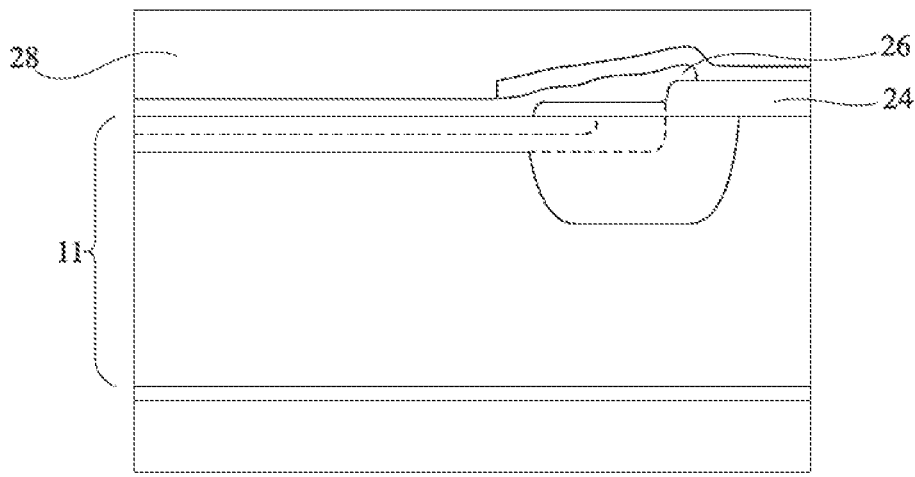
FIG. 2E partially shows the result of another manufacturing step of the embodiment of FIG. 1.

FIG. 2E partially shows the result of another manufacturing step of the embodiment of FIG. 1.

During this step, a conductive layer is formed on the structure of FIG. 2D. This conductive layer is then etched to form layer 26. Layer 26 is thus in contact with substrate 11 through the opening in layer 24. Layer 26 thus forms an electrode of the diode.

Insulating layer 28 is then formed on the structure, particularly covering layer 26.

The forming of the device may also comprise steps, not shown, for example, the forming of conductive vias, for example crossing layer 28 to couple layer 26 to other electronic components.

It could have been chosen not to carry out the step corresponding to FIG. 2C. The doping of area 30 would then be performed through the opening of the insulating layer deposited at the step of FIG. 2D. Area 30 would thus not extend under layer 24. However, in operation, a charge reservoir would then form in the end of area 30, that is, the portion closest to layer 24. This would cause, during the operation, in particular in thin diodes, the forming of a current filament extending from this portion to layer 18. Along this filament, particular at the level of layer 18, the temperature would increase, for example, up to temperatures likely to reach more than 300° C. This might cause the degradation of the diode and of layer 18, for example, by separating layer 18 from the substrate.

An advantage of the described embodiments is that the overlapping of area 30 with the oxide enables to avoid the forming of too large a charge reservoir in a relatively small volume. This thus decreases the risk of degradation of the diode.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

A device comprising a diode (10) wherein the anode of the diode may be summarized as including first (30), second (32), and third (34) areas, the first area (30) partially covering the second area (32) and having a doping level greater than the doping level of the second area (32), the second area (32) partially covering the third area (34) and having a doping level greater than the doping level of the third area (34), a first insulating layer (24) partially overlapping the first and second areas.

A method of manufacturing a diode (10) may be summarized as including the forming of first (30), second (32), and third (34) areas, the first area (30) partially overlapping the second area (32) and having a doping level greater than the doping level of the second area (32), the second area (32) partially covering the third area (34) and having a doping level greater than the doping level of the third area (34), a first insulating layer (24) partially overlapping the first and second areas.

The first area (30) may be covered with the first insulating layer (24) and a conductive layer (26).

The doping level of the first area (30) may be at least 10 times greater than the doping level of the second area (32) and the doping level of the second area (32) may be at least 10 times greater than the doping level of the third area (34).

The doping level of the first area (30) may be in the range from 1e17 atoms/cm3 to 1e20 atoms/cm3, the doping level of the second area (32) may be in the range from 1e15 atoms/cm3 to 1e17 atoms/cm3, and the doping level of the third area (34) may be in the range from 1e14 atoms/cm3 to 1e17 atoms/cm3.

The overlapping of the first area (30) by the first insulating layer (24) may extend over a length at least equal to 5 μm, preferably at least equal to 10 μm.

The overlapping of the first area (30) by the first insulating layer (24) may extend over a portion in the range from one quarter to three quarters of the overlapping of the second area (32) by the first insulating layer (24).

The first insulating layer (24) may extend over the entire periphery of the first area (30).

At least a portion of the third area (34) may extend down to a depth greater than the depth of the first (30) and second (32) areas.

The first (30), second (32), and third (34) areas may be in contact with the first insulating layer (24).

The method may include the forming, in a semiconductor substrate (11), of a guard ring (20) in the periphery of the location of the diode (10), the ring having a doping level substantially to that of the third area (34).

The method may include the forming of a second insulating layer (40) including a first opening exposing the substrate (11) inside of the ring and a portion of the ring and including the doping, through the first opening, of a portion of the substrate with the doping level of the second area (32).

The method may include the forming of a third insulating layer (24) and the doping, through the third insulating layer, of a portion of the substrate (11) with the doping level of the first area (30).

The method may include the forming of a second opening partially exposing the location of the first area (30).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a diode having an anode, the anode of the diode including:
   first, second, and third areas, the first area on the second area and having a first doping level greater than a second doping level of the second area, the second area on the third area, the second doping level being greater than a third doping level of the third area, the first area having first and second sides opposite to each other, the second area extending along the first side of the first area, between the first and second sides of the first area, and along the second side of the first area, the second area having first and second sides opposite to each other, the third area extending along the first side of the second area, between the first and second sides of the second area, and along the second side of the second area; and a first insulating layer partially overlapping the first and second areas.

2. The device according to claim 1, wherein the first area is covered with the first insulating layer and a conductive layer.

3. The device according to claim 1, wherein the first doping level of the first area is at least 10 times greater than the second doping level of the second area, and the second doping level of the second area is at least 10 times greater than the third doping level of the third area.

4. The device according to claim 1, wherein the first doping level of the first area is within a range from 1e17 atoms/cm3 to 1e20 atoms/cm3, the second doping level of the second area is within a range from 1e15 atoms/cm3 to 1e17 atoms/cm3, and the third doping level of the third area is within a range from 1e14 atoms/cm3 to 1e17 atoms/cm3.

5. The device according to claim 1, wherein the overlapping of the first area by the first insulating layer extends over a length of at least 5 μm.

6. The device according to claim 1, wherein the overlapping of the first area by the first insulating layer extends over a portion within a range from one quarter to three quarters of the overlapping of the second area by the first insulating layer.

7. The device according to claim 1, wherein the first insulating layer extends over an entire periphery of the first area.

8. The device according to claim 1, wherein at least a portion of the third area extends down to a depth greater than a depth of the first area and a depth of the second area.

9. The device according to claim 1, wherein the first, second, and third areas are in contact with the first insulating layer.

10. A device, comprising:
an anode including first, second, and third areas, the first area overlapping the second area and having a first doping level greater than a second doping level of the second area, the second area overlapping the third area and having the second doping level greater than a third doping level of the third area; and
a first insulating layer overlapping the first and second areas and extending over an entire periphery of the first area.

11. The device of claim 10, comprising a conductive layer covering the first area and the first insulating layer.

12. The device of claim 10, wherein the first doping level of the first area is at least 10 times greater than the second doping level of the second area, and the second doping level of the second area is at least 10 times greater than the third doping level of the third area.

13. The device of claim 10, wherein the overlapping of the first area by the first insulating layer extends over a portion in a range of one quarter and three quarters of the overlapping of the second area by the first insulating layer.

14. A device, comprising:
a substrate;
an anode in the substrate, the anode including:
a guard ring in the substrate, the guard ring has a first doping level;
a first doped region in the guard ring, the first doped region having first and second sides opposite to each other and a second doping level different from the first doping level, the guard ring extending along the first side of the first doped region, between the first and second sides of the first doped region, and along the second side of the first doped region;
a second doped region in the first doped region, the second doped region having first and second sides opposite to each other and a third doping level that is different from the second doping level, the first doped region extending along the first side of the second doped region, between the first and second sides of the second doped region, and along the second side of the second doped region.

15. The device of claim 14 wherein the guard ring includes an outer portion that is a greater depth into the substrate than an inner portion.

16. The device of claim 15, comprising an insulating layer on the substrate and an opening in the insulating layer, the insulating layer covering the outer portion of the guard ring, the opening being aligned with the inner portion.

17. The device of claim 16, comprising a conductive layer on the insulating layer and in the opening.

18. The device of claim 17 wherein the conductive layer is in contact with the second doped region.

* * * * *